United States Patent [19]
Dreps et al.

[11] Patent Number: 5,870,592
[45] Date of Patent: Feb. 9, 1999

[54] CLOCK GENERATION APPARATUS AND METHOD FOR CMOS MICROPROCESSORS USING A DIFFERENTIAL SAW OSCILLATOR

[75] Inventors: Daniel Mark Dreps, Georgetown; Robert Paul Masleid; John Stephen Muhich, both of Austin, all of Tex.

[73] Assignee: International Business Machines Corp., Armonk, N.Y.

[21] Appl. No.: 742,220

[22] Filed: Oct. 31, 1996

[51] Int. Cl.[6] ............................................. G06F 1/04
[52] U.S. Cl. ............................................. 395/555
[58] Field of Search .................................. 395/551, 552, 395/555, 556, 558, 559; 375/362, 371, 375; 370/516, 518

[56] References Cited

U.S. PATENT DOCUMENTS

| | | | |
|---|---|---|---|
| 4,489,289 | 12/1984 | Slobodnik et al. . | |
| 4,715,049 | 12/1987 | Andrews et al. . | |
| 4,801,818 | 1/1989 | Schroedinger . | |
| 4,893,271 | 1/1990 | Davis et al. | 364/900 |
| 4,903,228 | 2/1990 | Gregoire et al. . | |
| 5,056,054 | 10/1991 | Wong et al. | 364/724.01 |
| 5,077,529 | 12/1991 | Ghoshal et al. | 328/155 |
| 5,150,078 | 9/1992 | Yang et al. . | |
| 5,166,952 | 11/1992 | Omurg et al. . | |
| 5,179,574 | 1/1993 | Watanabe et al. . | |
| 5,253,268 | 10/1993 | Omura et al. . | |
| 5,317,284 | 5/1994 | Yang . | |
| 5,349,310 | 9/1994 | Rieder et al. | 331/18 |
| 5,396,523 | 3/1995 | Hedberg . | |
| 5,526,380 | 6/1996 | Izzard . | |

FOREIGN PATENT DOCUMENTS

2128824A 5/1984 Germany .......................... H03L 7/08

OTHER PUBLICATIONS

Digital Technical Journal, "Circuit Implementation of a 300–MHz 64–bit Second–generation CMOS Alpha CPU", vol. 7, No.1, 1995, pp. 100–115.

*Primary Examiner*—Dennis M. Butler
*Attorney, Agent, or Firm*—Kermit D. Lopez; Anthony V. S. England

[57] ABSTRACT

A clock generation apparatus and method for generating clock signals for a microprocessor integrated circuit. The clock generation apparatus includes a device which generates a reference frequency, an acoustic wave oscillator having an oscillation frequency slightly faster than the reference frequency and a circuit configuration coupled to the acoustic wave oscillator which generates frequency bearing signals in response to an output of the acoustic wave oscillator. The frequency bearing signals carry negligible jitter. The circuit configuration includes a quadrature rotator for controlling clock phase, a clock distributor for efficiently dispersing clock signals to the microprocessor integrated circuit, a bus divider which provides a feedback clock signal phase aligned with the reference frequency, a phase detector for detecting the phase difference of a bus clock signal and the feedback clock signal, and a digital filter responsive to the phase detector.

8 Claims, 4 Drawing Sheets

CLOCK GENERATION APPARATUS AND METHOD FOR CMOS MICROPROCESSORS USING A DIFFERENTIAL SAW OSCILLATOR

BACKGROUND OF THE INVENTION

1. Technical Field

The invention relates in general to integrated circuit technology and more particularly to a design for clock generation devices used in integrated circuit microprocessors. In particular the invention relates to clock generation devices utilized in CMOS microprocessor integrated circuits. Still more particularly, the invention relates to clock generation devices which utilize a differential SAW (Surface Acoustic Wave) oscillator or an ordinary crystal oscillator as a clock frequency source, and which provides negligible jitter, improvements in cycle time, and which is primarily digital in nature.

2. Description of the Related Art

A clock generation design that produces less jitter than is currently available in monolithic PLL (Phase-Locked Loop) designs of noisy microprocessor CMOS chips is a goal sought by integrated circuit designers. A PLL is a system that uses feedback to maintain an output signal in specific phase relationship with a reference signal. PLLs are used in many areas of electronics to control the frequency and/or phase of a signal. These applications include frequency synthesizers, analog and digital modulators and demodulators, and clock recovery circuits.

In the design of integrated microprocessor circuits utilizing dynamic circuits, it is highly desirable to employ circuits having low jitter. Jitter is any vibration or fluctuation in a given signal. In television and computer monitors, for example, jitter is often visible in horizontal lines that are the same thickness as scan lines. In integrated circuit devices, jitter is often the result of supply noise and substrate noise. In high-resolution graphic display devices utilizing PLL designs, the jitter performance of PLLs limits the system performance. Power-supply noise coupling is a major cause of PLL jitter problems, especially with low-supply voltages and with multiple clock synthesizers on the same device.

The use of PLLs for microprocessor clock generation is well known in the art of integrated circuits. For PLLs that are on the same chip as a high-performance microprocessor, the power supply switching noise of the digital circuits (i.e. 10% of the supply voltage) is the major noise source for output jitter. To reduce jitter, the power supply noise rejection of analog circuits inside the PLL must be maximized. For low-power PLLs, a second jitter source is the intrinsic noise of MOS devices in the VCO (Voltage Controlled Oscillator). A VCO is a circuit that produces an AC output signal whose frequency is proportional to the input control voltage. This noise can be reduced by increasing the power consumption.

To obtain low-voltage analog circuits, the saturation voltage of MOS devices needs to be reduced by using wider devices. This results in a larger parasitic capacitance between the supply voltage and the analog nodes, decreasing the power supply noise rejection for the same current consumption. The challenge in using PLLs for microprocessor clock generation is to design a PLL which combines limited jitter, low-supply voltage and low-power consumption. Despite improvements in reducing jitter in PLL based systems, current state of the art PLL based systems only manage jitter and skew sums in the range of 200–300 ps (picoseconds). An alternative to strictly PLL based systems is the addition of a SAW (Surface Acoustic Wave) oscillator to such PLL based systems.

A SAW, also called a Rayleigh wave, is composed of a coupled compressional and shear wave in which the SAW energy is confined near the surface. There is also an associated electrostatic wave for a SAW on a piezoelectric substrate which allows electroacoustic coupling via a transducer. Two key advantages of SAW technology are its ability to electroacoustically access and tap the wave at the crystal surface and a wave velocity approximately 10,000 times slower than an electromagnetic wave. There are a large number of materials which are currently being used for SAW devices. The most popular materials are quartz, lithium niobate, and lithium tantalate.

Crystal oscillators are today at the heart of every clock that does not derive its reference frequency from an AC power line. They are also used in color television sets and personal computers. In these applications at least one (or more) "quartz crystal" controls frequency or time, which explains the label "quartz" which appears on many clocks and watches.

Current SAW oscillators have jitter values of 10–20 ps (picoseconds) with 200 mv of power supply noise. Jitter reduction results in two major benefits at the system level. A jitter reduction of 10X results in increased system performance over current best of breed PLLs. Second, long term accumulation of cycle to cycle jitter as a function of power supply or substrate fluctuations, which results in the accumulation of errors, is reduced allowing for faster chip to chip I/O transfers where long term jitter is an increased factor. These benefits are particularly enhanced in multiphase clock systems.

A typical SAW oscillator utilized in the electronics industry today is the SC0017A 400 MHz Differential-Sinewave Clock manufactured by RF Monolithics, Inc. (RFM®). This device is a quartz based oscillator which provides SAW frequency stability. A fundamental fixed frequency and very low jitter and power consumption are hallmarks of the device. The digital clock is designed for use with high speed CPUs and digitizers. Fundamental oscillation is made possible by utilizing SAW technology. Current SAW oscillators are fabricated in the 100 to 800 MHz range for minimal cost. This is the range of current microprocessor clock frequencies.

The difficulty in utilizing SAW oscillators with clock generation devices is that such SAW based devices must replace conventional PLL systems. Conventional PLL systems operate with internal oscillation devices. A SAW based device, in order to provide varying frequencies, would be external to the system. In essence, a PLL clock generation circuit must be designed with the SAW oscillator in mind.

PLL systems are typically synchronized in CMOS microprocessors to a master reference clock, allowing for the addition of multiple processors and maintaining a common synchronization boundary. PLL systems designed today are also typically analog based. However, such analog devices provide a great deal of jitter, whether positive or negative. A digital PLL clock generation system which is primarily digital in nature will allow for reduced or negligible jitter. Such digital systems are uncommon and difficult to implement. Designing a PLL based clock generation circuit having minimal or negligible jitter which utilizes an external SAW oscillator is a desirable design goal, one sought by designers in the integrated electronics industry today.

SUMMARY OF THE INVENTION

It is therefore an object of the invention to provide for a clock generation device used in integrated circuit microprocessors.

It is another object of the invention to provide a clock generation device utilized in CMOS microprocessor integrated circuits.

It is still another object of the invention to provide for a clock generation device which utilizes differential SAW oscillators, allowing for negligible jitter and additionally providing improvements in cycle time.

It is yet another object of the invention to provide for a clock generation device which is primarily digital in nature and which utilizes a differential SAW oscillator as a clock frequency source.

The above and other objects are achieved as is now described. A clock generation apparatus and method for generating clock signals for a microprocessor integrated circuit are discussed. The clock generation apparatus includes a device which generates a reference frequency, an acoustic wave oscillator having an oscillation frequency slightly faster than the reference frequency and a circuit configuration coupled to the acoustic wave oscillator which generates frequency bearing signals in response to an output of the acoustic wave oscillator. The frequency bearing signals carry negligible jitter. The circuit configuration includes a quadrature rotator for controlling clock phase, a clock distributor for efficiently dispersing clock signals to the microprocessor integrated circuit, a bus divider which provides a feedback clock signal phase aligned with the reference frequency, a phase detector for detecting the phase difference of a bus clock signal and the feedback clock signal, and a digital filter responsive to the phase detector.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
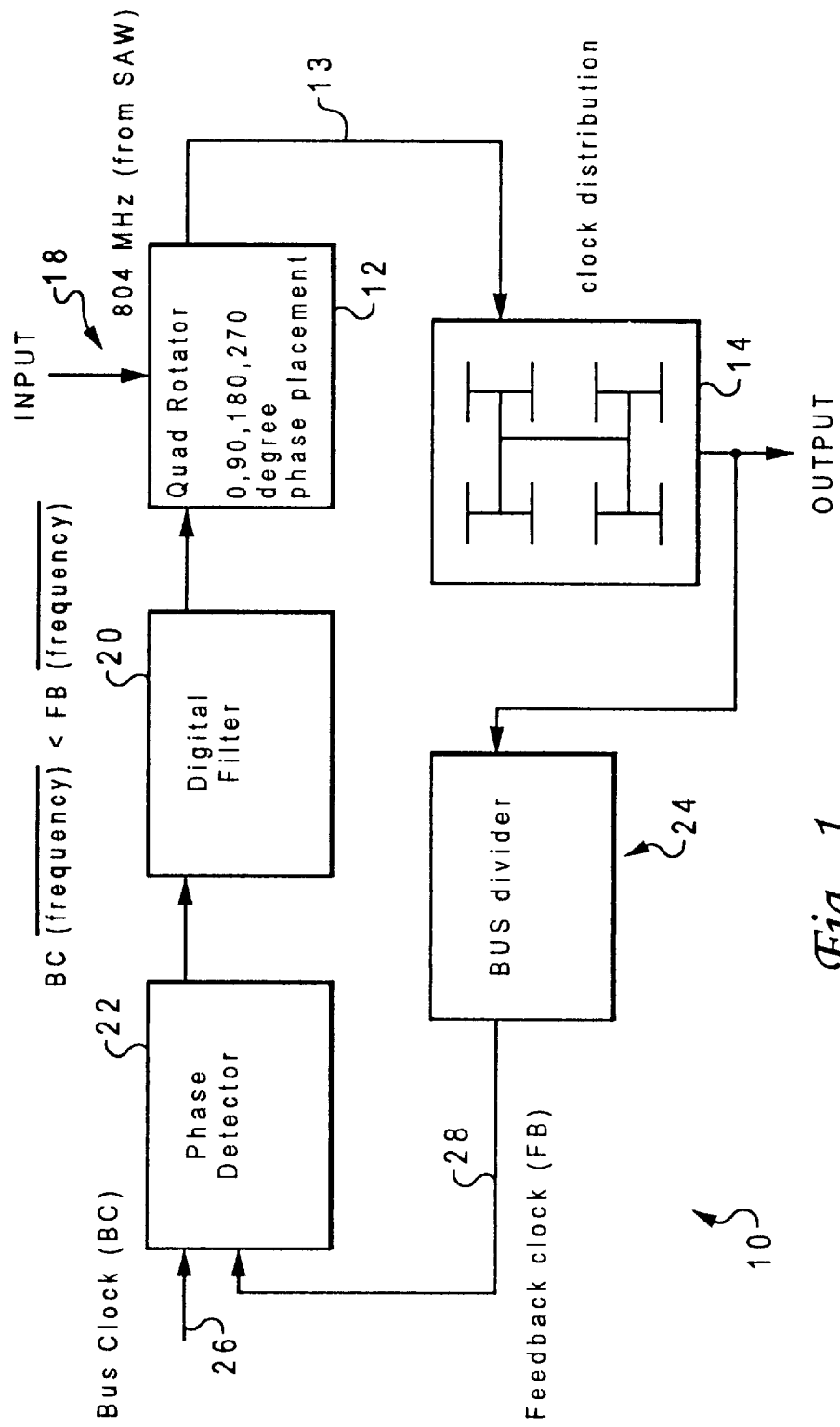
FIG. 1 is a schematic diagram of a clock generator utilizing a SAW device.

With reference now to the figures and in particular with reference to FIG. 1, a schematic diagram of a clock generator 10 which may be utilized in accordance with the present invention is depicted. Clock generator 10 includes a quadrature rotator 12 which receives input 18 from a SAW oscillator (not shown). A signal 13 is routed via a clock distribution network 14 to a microprocessor integrated circuit (not shown) which incorporates the clock distribution network 14. The signal routed through clock distribution network 14 is provided as output from clock distribution network to bus divider 24.

Bus divider 24 couples feedback clock signal 28 to phase detector 22. Phase detector 22 receives two signals, feedback clock signal 28 and bus clock signal 26. Phase detector 22 produces a digital (i.e. based on "1" and "0" conditions) output voltage. For example, if the phase difference of bus clock signal 26 and feedback clock signal 28 is detected by phase detector 22, an output voltage "high" or "1" is produced by phase detector 22. Output from phase detector 22 is coupled with input to digital filter 20. Output from digital filter 20 is then sent to quadrature rotator 12, completing a feedback circuit which incorporates feedback from the microprocessor integrated circuit. Feedback clock 28 is phase aligned to a bus clock signal 26, which acts as a reference clock for clock generator 10.

The embodiment of FIG. 1 requires one SAW oscillator per processor for signal integrity reasons (e.g. to simplify transmission line design). For example, with one SAW oscillator, shorter wire length and a reduction in stub effects are achieved. Having one SAW oscillator per processor introduces asynchronous boundaries for a multi-processor environment. SAW oscillators are generally designed for a center frequency variation of +/−200 ppm. For a 400 MHz clock, for example, a center frequency variation of +/−200 ppm results in an average difference of 160 kHz or in time, 1 ps per cycle.

The SAW oscillator is chosen such that its oscillator frequency is slightly faster than a reference frequency provided by the reference clock (i.e. bus clock 26). This boundary condition insures than in order to synchronize the system, phase compensation must take place, and that such compensation will act only to stretch the microprocessor clock cycle time and only on occasion, because of the precision and small frequency separation of the bus clock (i.e. multiplied via bus divider 24) and the SAW oscillator. Note that numerous integer multiplier are possible with other embodiments and are not limited to the multiplier value of the preferred embodiment. Thus, the aforementioned technique limits the cycle reduction jitter to only that jitter intrinsic to the SAW oscillator, which is on the order of 10 ps, a negligible jitter value. Because the configuration of FIG. 1 is a clocked system, cycle slip jitter or stretching will not cause internal timing problems.

Clock generator 10 is a digital lock loop, which is a digital implementation of a PLL. Ordinary PLLs are analog in nature and provide a frequency multiplier function and a PLL function. A PLL regulates an internal PLL frequency to match a bus clock (or reference) frequency to create positive and negative jitter. PLLs usually have local oscillators. The configuration of FIG. 1 utilizes an external oscillator (i.e. external to the loop). In FIG. 1, a SAW oscillator provides a frequency slightly higher than the reference frequency. For example, an oscillator with a SAW oscillator frequency of 804 MHz can be chosen for a reference frequency of 200 MHz, where bus divider 24 provides a multiplier function (i.e. a multiplier of 4). 200 MHz multiplied by 4 is 800 MHz. Thus, 804 Mhz as provided by the SAW oscillator is only slightly greater than 800 MHz. Other values can also be chosen.

Typical PLL jitter is about 10% of cycle time. Thus, the SAW oscillator frequency must not exceed 10% of the value of the reference frequency, factoring in the multiplier function provided by bus divider 24 of FIG. 1. Thus, the frequency range of a reference signal (also provided by a crystal oscillator) plus the frequency range of the SAW oscillator must be smaller than the separation of their reference frequency. Conventional PLLs regulate a local oscillator and so unavoidably provide both positive and negative jitter. Negative jitter is undesirable because it shortens the available processor time. The configuration provided in FIG. 1 uses an external SAW oscillator having a slightly excessive frequency, achieving phase regulation with only positive jitter because only frequency reduction is required. Such a configuration can only be properly achieved if the necessary precision in both the SAW oscillator and bus clock 26 is available, as in the present invention.

Figure 2:
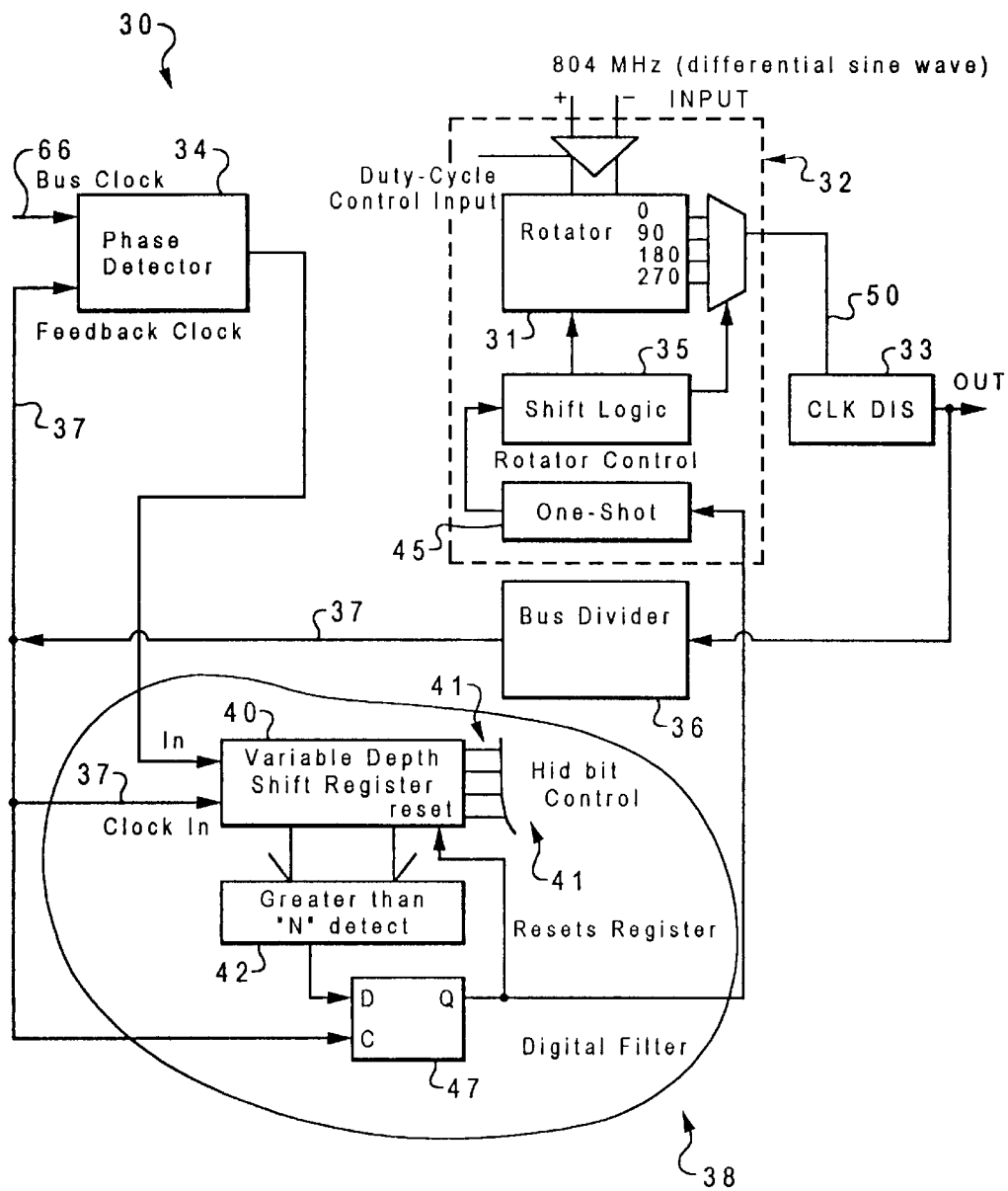
FIG. 2 is a more detailed schematic diagram of a clock generator utilizing a SAW device.

FIG. 2 is a more detailed version of the configuration of FIG. 1. The clock generator 30 of FIG. 2 includes a quadrature rotator 32 whose output is sent to clock distribution network 33. Quadrature rotator 32 includes three major blocks—rotator 31, shift logic 35, and a "one shot" multivibrator 45. Dashed lines in FIG. 2 approximate the region of the circuit which composes quadrature rotator 32. There are four clocks within rotator 31. Each of the clocks are approximately 50% duty cycle with rising edges occurring at N=0 degrees, N+1=90 degrees, N+2=180 degrees, and N+3=270 degrees. At any time instance, rotator 31 may be at N, N+1, N+2, or N+3. If rotator 31 is at N, the next shift available is N+1 and so on up to N+3. N+3 will shift to N. This forms the "rotation". "One shot" multivibrator 45 is a pulse generator, well known in the electronics art, which receives a signal from digital filter 38 and in turn transfers "single shot" pulses to shift logic 35. Shift logic 35 and "one shot" multivibrator 45 act in concert as the rotator control for quadrature rotator 32.

Output from clock distribution network 33 is received by bus divider 36 which in turn produces a feedback clock signal 37 which is coupled with digital filter 38 and phase detector 34. Output from phase detector 34 is coupled with variable shift register 40. Phase detector 34 receives input from bus clock 66 (not shown) and feedback clock 37 and performs the same function as digital filter 22 of FIG. 1. Digital filter 38 includes variable depth shift register 40, and a greater than "N" detector 42 which detects a value greater than N. Greater than "N" detector 42 performs a comparison function. The comparison of two numbers is an operation that determines if one number is greater than, less than, or equal to the other number. Greater than "N" detector 42 is a logical comparator which specifically yields a change in output if an input value is greater than the value N. Greater than "N" detector 42 thus acts as a filter. A flip-flop 47 receives input from greater than "N" detector 42 and feedback clock 37. Flip-flip 47 is a D flip-flop with a D (data) and C (clock) input, along with a Q (state) output. A D flip-flip is ideal for use in a clock generation circuit for a microprocessor because a D type flip-flop generally takes up little space on an integrated circuit chip.

Output from flip-flop 47 is returned as input to the reset pin of variable depth shift register 40 and simultaneously coupled with shift logic 35, which assists quadrature rotator 32. Output from shift logic 35 is received by quadrature rotator 32 and one of its four clocks (i.e. 0, 90, 180 or 270 degrees), thus completing a feedback loop. Variable depth shift register 40 includes lines 41 for "hid bit" control. The loop response time of clock generator 30 can be set via these hid bits (i.e. reserved bits) that allow for trimming of the loop response time if the circuit must be utilized in another context having a significantly different drift specification.

Phase detector 34 specifically provides a digital "1" if feedback clock 37 is earlier in phase than bus clock 66, which corresponds to the situation where feedback clock 37 is faster than bus clock 66 for too long a length of time. Variable depth shift register 40 counts clock pulses whenever phase detector 24 provides a digital "1". Greater than "N" detector 42 acts to set flip-flop 47 (i.e. a latch) when a high enough count has been exceeded. Thus, many phase detections are required to cause a phase adjustment, which results in the filtering out of noise from phase detector 34 and its power supply. When flip-flop 47 goes to a digital "1", "one shot" multivibrator 45 activates shift logic 35 to advance rotator 31 from N to N+1 or N+1 to N+2 or N+2 to N+3 or N+3 to N. Advancing the rotator in this manner retards output 50 by 90 degrees of phase, slowing feedback clock 37.

Quadrature rotator 32 is responsive to a signal from the SAW oscillator. The SAW oscillator produces an 804 MHz differential sine wave. The SAW oscillator can by any type of SAW oscillator which provides quartz SAW frequency stability and a fundamental fixed frequency. A SAW oscillator of this type also provides very low jitter and power consumption and is usually rugged and provided with a miniature surface-mount case. Such a SAW oscillator is designed for use with high speed CPUs and digitizers where fundamental oscillation is made possible by surface acoustic wave (SAW) technology.

Figure 3:
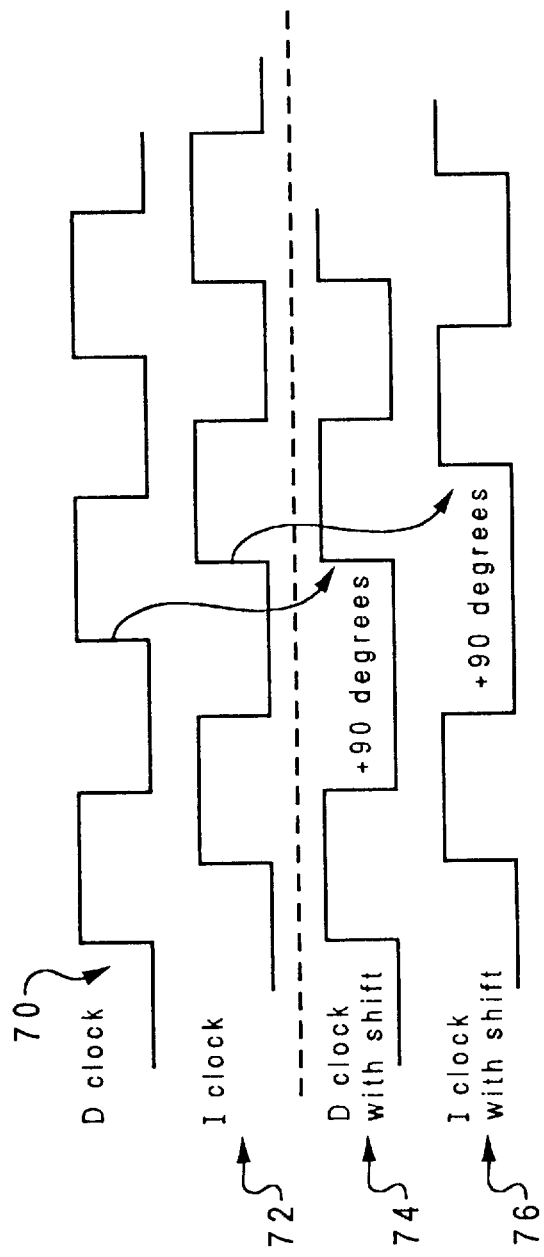
FIG. 3 is a timing diagrams of two different phase events.

FIG. 3 is a timing diagram of two different phase events, depicting a phase relationship resulting from the operation of quadrature rotator 32. To maintain a known phase relationship, it is necessary to delay the next rising edges of the D clock 70 and the I clock 72 by 90 degrees or 625 ps at 400 MHz. FIG. 3 graphically depicts this delay. The D clock 70 and the I clock 72 are generated by a four clock rotator such as quadrature rotator 32. D clock with a 90 degree shift is shown at 74 and I clock with a 90 degree shift is shown at 76 in FIG. 3.

Phase detector 34 is responsible for the phase relationship shown in FIG. 3. As previously explained, bus clock 66 of FIG. 2, which is slightly slower than feedback clock 37, is deliberately chosen for use with clock generator 30. Choosing bus clock 66 with such a frequency value insures unidirectional phase correction. Over time, the phase of feedback clock 37 slides through the phase of bus clock 66. Following the initial time that the phase of feedback clock 37 slides through the phase of bus clock 66, synchronization begins.

Figure 4:
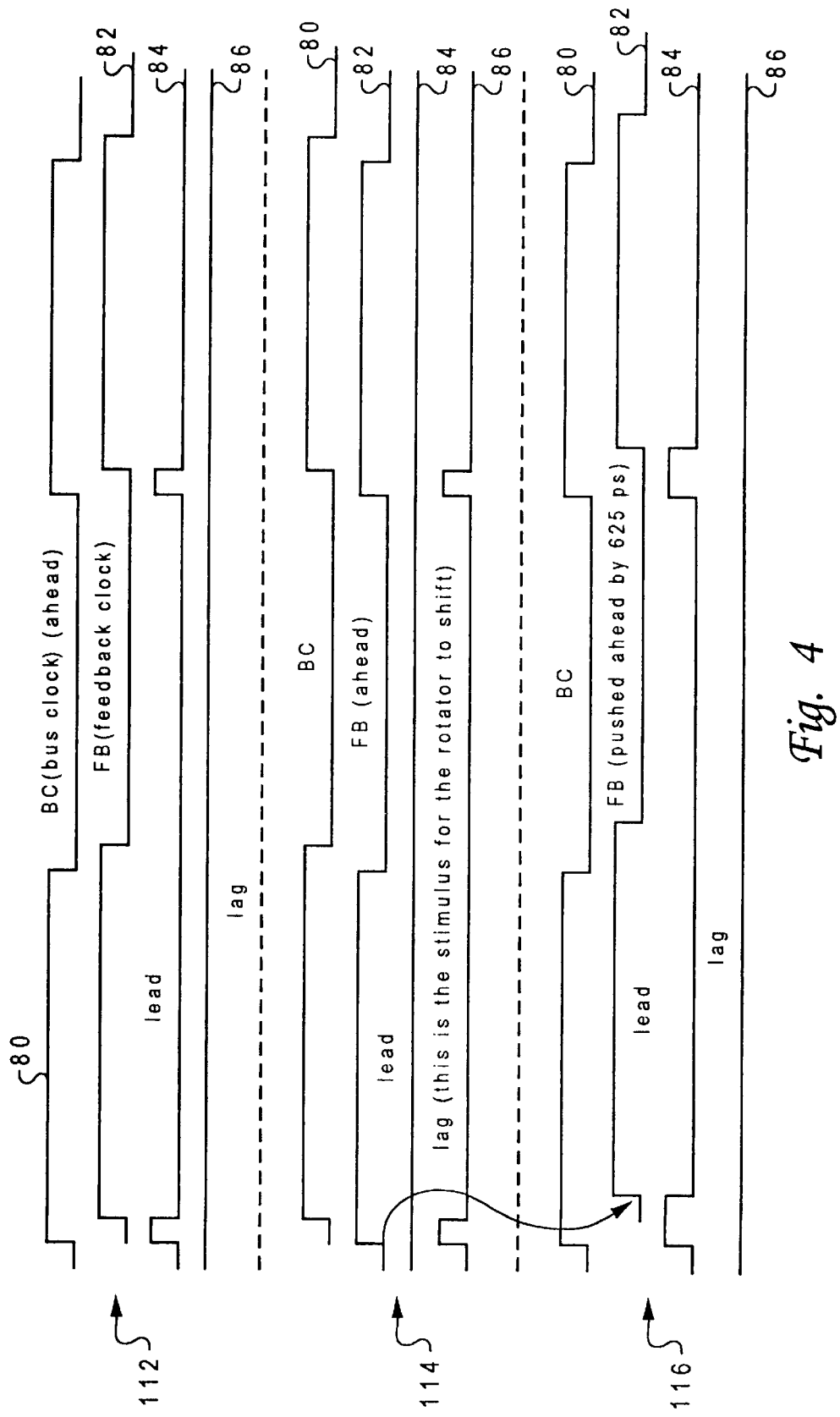
FIG. 4 is a timing diagram of three different phase events.

FIG. 4 shows timing diagrams of these events, specifically depicting three phase events. In FIG. 4, three "snapshots" of this event are shown. A first timing diagram 112 depicts the phase 80 of bus clock 66 of FIG. 2, the phase 82 of feedback clock 37 of FIG. 2, and respective lead 84 and lag 86 phases. A second timing diagram 114 and a third timing diagram 116 also depict later events of respective phases 80, 82 84 and 86. As shown in the timing diagrams of FIG. 4, over time phase 82 of feedback clock 37 slides through phase 80 of bus clock 66. The sequence shown in FIG. 4 repeats to keep the phase of feedback clock 37 aligned with respect to the phase of bus clock 66.

For the specific case of FIG. 4, the phase relationship defined is ¼ cycle granularity or for 400 MHz, approximately 2500/4=625 ps. The long term jitter produced by feedback clock 37 with respect to bus clock 66 is 625 ps. An examination of FIG. 4 reveals that the range of uncertainty is defined by a jump in phase. Specifically, consider timing diagrams 114 and 116. In timing diagram 116, the frequency 82 of feedback clock 31 is pushed ahead by 625 ps. Assuming that the feedback clock 37 and bus clock 66 are running at 0.1 of the microprocessor frequency, 10 microprocessor cycles will have occurred by the next rising edge of the frequency 82 of feedback clock 37 if the phase shift of the microprocessor cycle is 1 ps per cycle or 10 ps for 10 cycles.

The preferred embodiment of the invention presented herein results in jitter reduction in a high frequency clock generation path from 200–300 ps (i.e. as in present PLL devices) to approximately 10–20 ps. Selecting 804 Mhz for an 800 Mhz system which implements a SAW oscillator reduces cycle time by 6 ps or 0.5%, a fixed reduction in cycle time. Use of the quadrature rotator approach described herein and phase detector 34 of FIG. 2 results in a phase locked loop.

The configuration described is useful for multi-processor environments that utilize PLLs. Also, because only the negative high frequency jitter associated with the configuration results from SAW jitter (which is negligible), no additional quantization error or analog PLL white noise or loop dynamic jitter is added to the high frequency microprocessor clock. However, positive jitter or edge delay is added, but microprocessor throughput is compensated for this delay by selecting a SAW center frequency that is higher than the nominal or worse case anticipated slip rate. The configuration presented herein also results in higher microprocessor performance over conventional on-chip PLL designs. In addition, for digital or differential circuit designs which utilize this configuration, sensitive analog nodes are not required.

While the invention has been particularly shown described with reference to a preferred embodiment, it will be understood by those skilled in the art that various changes in form and detail may be made therein without departing from the spirit and scope of the invention.

What is claimed is:

1. A method for generating a clock signal, comprising the steps of:

generating a plurality of source signals having time varying phase differences with respect to a reference signal, wherein the source signals are generated from an oscillator having a substantially fixed frequency output signal, so that the source signals have a substantially fixed frequency; and selecting a first one of the source signals to supply a clock signal, wherein the source signals' frequency is higher than the frequency of the reference signal, so that a phase difference, between the clock signal and the reference signal, increases with time;

detecting, by a phase detector, that the clock signal is earlier in phase than the reference signal;

counting cycles of the clock signal during which the chase detector detects the earlier clock signal; and selecting a second one of the source signals, to replace the first one of the source signals in supplying the clock signal, responsive to the cycle count exceeding a predetermined limit.

2. The method of claim 1, wherein the second source signal has a fixed, lagging phase difference with respect to the first source signal, and the replacing of the first source signal by the second source signal occurs when the fixed lagging phase difference substantially offsets the clock signal-reference signal phase difference.

3. The method of claim 2, comprising the step of:

selecting a third one of the source signals, to replace the second one of the source signals in supplying the clock signal, responsive to the cycle count exceeding the predetermined limit.

4. The method of claim 3, wherein the source signals supply the clock signal on a chip, and the oscillator is external to the chip, so disturbances on the chip have a reduced effect on the oscillator output signal frequency.

5. An apparatus for generating a clock signal, comprising:

means for generating a plurality of source signals having time varying phase differences with respect to a reference signal, wherein the source signals are generated from an oscillator having a substantially fixed frequency output signal, so that the source signals have a substantially fixed frequency; and means for selecting a first one of the source signals to supply a clock signal, wherein the source signals' frequency is higher than the frequency of the reference signal, so that a phase difference, between the clock signal and the reference signal, increases with time;

a phase detector for detecting that the clock signal is earlier in phase than the reference signal;

a cycle counter, responsive to the phase detector, for counting cycles of the clock signal during which the phase detector detects the clock signal-reference signal phase difference limit; and means for replacing the first one of the source signals in supplying the clock signal with a second one of the source signals, responsive to the cycle count exceeding a predetermined limit.

6. The apparatus of claim 5, wherein the second source signal has a fixed, lagging phase difference with respect to the first source signal, and wherein the replacing of the first source signal by the second source signal substantially offsets the clock signal-reference signal phase difference.

7. The apparatus of claim 6 wherein the replacing means selects a third one of the source signals, to replace the second one of the source signals in supplying the clock signal responsive to the cycle count exceeding the predetermined limit.

8. The apparatus of claim 7, wherein the source signals supply the clock signal on a chip, and the oscillator is external to the chip, so disturbances on the chip have a reduced effect on the oscillator output signal frequency.

* * * * *

UNITED STATES PATENT AND TRADEMARK OFFICE
CERTIFICATE OF CORRECTION

PATENT NO. : 5,870,592
DATED : Feb. 9, 1999
INVENTOR(S) : Dreps et al

It is certified that error appears in the above-identified patent and that said Letters Patent is hereby corrected as shown below:

Column 7, line 38 please delete "chase" and insert --phase--;

Signed and Sealed this

Twentieth Day of July, 1999

Attest:

Attesting Officer

Q. TODD DICKINSON

Acting Commissioner of Patents and Trademarks